United States Patent
Kawaguchi et al.

(10) Patent No.: US 6,762,616 B2
(45) Date of Patent: Jul. 13, 2004

(54) PROBE SYSTEM

(75) Inventors: Koji Kawaguchi, Nirasaki (JP); Hiroshi Amemiya, Nirasaki (JP); Hiroshi Kaneko, Nirasaki (JP); Tatsuo Kawashima, Nirasaki (JP)

(73) Assignee: Tokyo Electron Limited, Tokyo-To (JP)

(*) Notice: Subject to any disclaimer, the term of this patent is extended or adjusted under 35 U.S.C. 154(b) by 0 days.

(21) Appl. No.: 10/317,088

(22) Filed: Dec. 12, 2002

(65) Prior Publication Data
US 2003/0112002 A1 Jun. 19, 2003

(30) Foreign Application Priority Data
Dec. 13, 2001 (JP) .................................. 2001-379377

(51) Int. Cl.[7] .................................................. G01R 31/26
(52) U.S. Cl. ........................ 324/765; 324/760; 324/158.1
(58) Field of Search .............................. 324/754, 755, 324/756, 758, 760, 765, 158.1

(56) References Cited

U.S. PATENT DOCUMENTS 5,473,258 A * 12/1995 Abe
6,414,478 B1 * 7/2002 Suzuki
6,501,289 B1 * 12/2002 Takekoshi

FOREIGN PATENT DOCUMENTS

| JP | 63-151036 | 6/1988 |
|---|---|---|
| JP | 04-024935 | 1/1992 |
| JP | 05-036766 | 2/1993 |
| JP | 2000-294606 | 10/2000 |

* cited by examiner

Primary Examiner—David A. Zarneke
Assistant Examiner—Tung X. Nguyen
(74) Attorney, Agent, or Firm—Smith, Gambrell & Russell, LLP

(57) ABSTRACT

A probe system according to the present invention includes a probe unit and a loader unit which are adjacent to each other. The probe unit has a case defining a prober chamber for receiving an object to be tested, and a contact probe for testing the object received into the prober chamber. The loader unit has a case defining a loader chamber partially communicated with the prober chamber, and a carrying mechanism for carrying the object between the prober chamber and the loader chamber. In the loader unit, a main shielding cover for covering the carrying mechanism in the loader chamber is provided. The probe system is provided with means for supplying dry air into the interior of the main shielding cover of the loader unit and the prober chamber.

6 Claims, 4 Drawing Sheets

PROBE SYSTEM

BACKGROUND OF THE INVENTION

1. Field of the Invention

The present invention relates to a probe system for electrically testing an object to be tested, such as a semiconductor wafer.

2. Description of the Related Art

Typically as shown in FIGS. 4A and 4B, a conventional probe system comprises a loader unit 1 for carrying and pre-aligning a wafer W, and a probe unit 2 for receiving the wafer W from the loader unit 1 to electrically test the wafer W. The loader unit 1 is provided with tweezers 3 and a sub-chuck 4. While the wafer W is carried by the tweezers 3, the wafer W is pre-aligned in the sub-chuck 4 on the basis of an orientation flat or notch.

The probe unit 2 is provided with a main chuck 5 and an alignment mechanism 6. A probe card 7 is detachably mounted on a head plate 8 which forms a ceiling of the probe unit 2. The main chuck 5 supporting thereon the wafer W is designed to move in directions X, Y, Z and θ (rotation about a vertical axis). The alignment mechanism 6 is designed to align the wafer W on the main chuck 5 with respect to probe needles 7A of the probe card 7. By causing the wafer W to electrically contact the probe needles 7A, electric characteristics of the wafer W are tested by means of a test head T.

The loader unit 1 is adjacent to the probe unit 2 via a partition wall 9. The partition wall 9 is provided with an opening 9A having a shutter. This shutter is designed to be open when the wafer W is transferred between the loader unit 1 and the probe unit 2 by means of the tweezers 3.

Tests of wafers W by the probe systems include a low temperature test and a high temperature test in addition to a room temperature test. Therefore, the main chuck 5 includes a temperature control mechanism. By using this temperature control mechanism, the temperature of the wafer W can be controlled in the range of from –tens ° C. to +160° C. For example, when a low temperature test at –40°° C. is carried out, the wafer W on the main chuck 5 is cooled to –40° C. by the temperature control mechanism. At this time, if no measures are taken, water vapor in air condenses and freezes on the surface of the wafer W. Thus, after dry air is filled in the probe unit 2, the dry air is circulated to prevent dew condensation and/or freezing.

For example, as shown in FIG. 4B, the probe unit 2 is provided with a fan filter unit (FFU) 2A and a circulating duct 2B for circulating dry air supplied to the interior of the probe unit 2, via the circulating duct 2B. Particles produced in the probe unit 2 and mixed in the dry air are removed by the filter of the FFU 2A.

However, in the case of such a method for circulating dry air, if the flow rate of circulating dry air is increased to improve cleanliness in the prove unit 2, it is not possible to expect a low dew point. Conversely, if the flow rate of circulating dry air is decreased to obtain a lower dew point, it is not possible to maintain cleanliness. Moreover, if the probe unit 2 is provided with both of the FFU 2A and the circulating duct 2B, costs are increased. In addition, when the wafer w is returned to the loader unit 1 from the probe unit 2, there is a possibility that water vapor in the loader unit 1 may condense and/or freeze on the cold wafer W.

SUMMARY OF THE INVENTION

It is therefore an object of the present invention to eliminate the aforementioned problems and to provide a probe system capable of preventing dew condensation and/or freezing on an object to be tested in a low temperature test while maintaining cleanliness in a probe unit, and capable of reducing production costs.

In order to accomplish the aforementioned and other objects, according to one aspect of the present invention, there is provided a probe system comprising: a probe unit having a case defining a prober chamber for receiving an object to be tested, and a contact probe for testing the object received into the prober chamber; and a loader unit having a case defining a loader chamber partially communicated with the prober chamber, and a carrying mechanism for carrying the object between the prober chamber and the loader chamber, wherein the loader unit further has a main shielding cover for covering the carrying mechanism in the loader chamber, and the probe system further comprises means for supplying dry air via a filter into an interior of the main shielding cover of the loader unit and the prober chamber.

In the above described probe system, the loader unit preferably has an alignment mechanism for aligning the object, the alignment mechanism being covered with the main shielding cover in the loader chamber.

In the above described probe system, the main shielding cover is preferably rotatable together with the carrying mechanism.

In the above described probe system, the case of the loader unit preferably has an opening for communication with the prober chamber, and the loader unit preferably has an auxiliary shielding cover for covering a space between the main shielding cover and the opening to define a carrying passage for the object. In this case, the opening is provided with a door for selectively closing the opening.

The above described probe system preferably further comprises means for supplying clean air into the loader chamber.

DESCRIPTION OF THE PREFERRED EMBODIMENTS

Referring now to the accompanying drawings, particularly to FIGS. 1 through 3, a preferred embodiment of a probe system according to the present invention will be described below.

Figure 1:
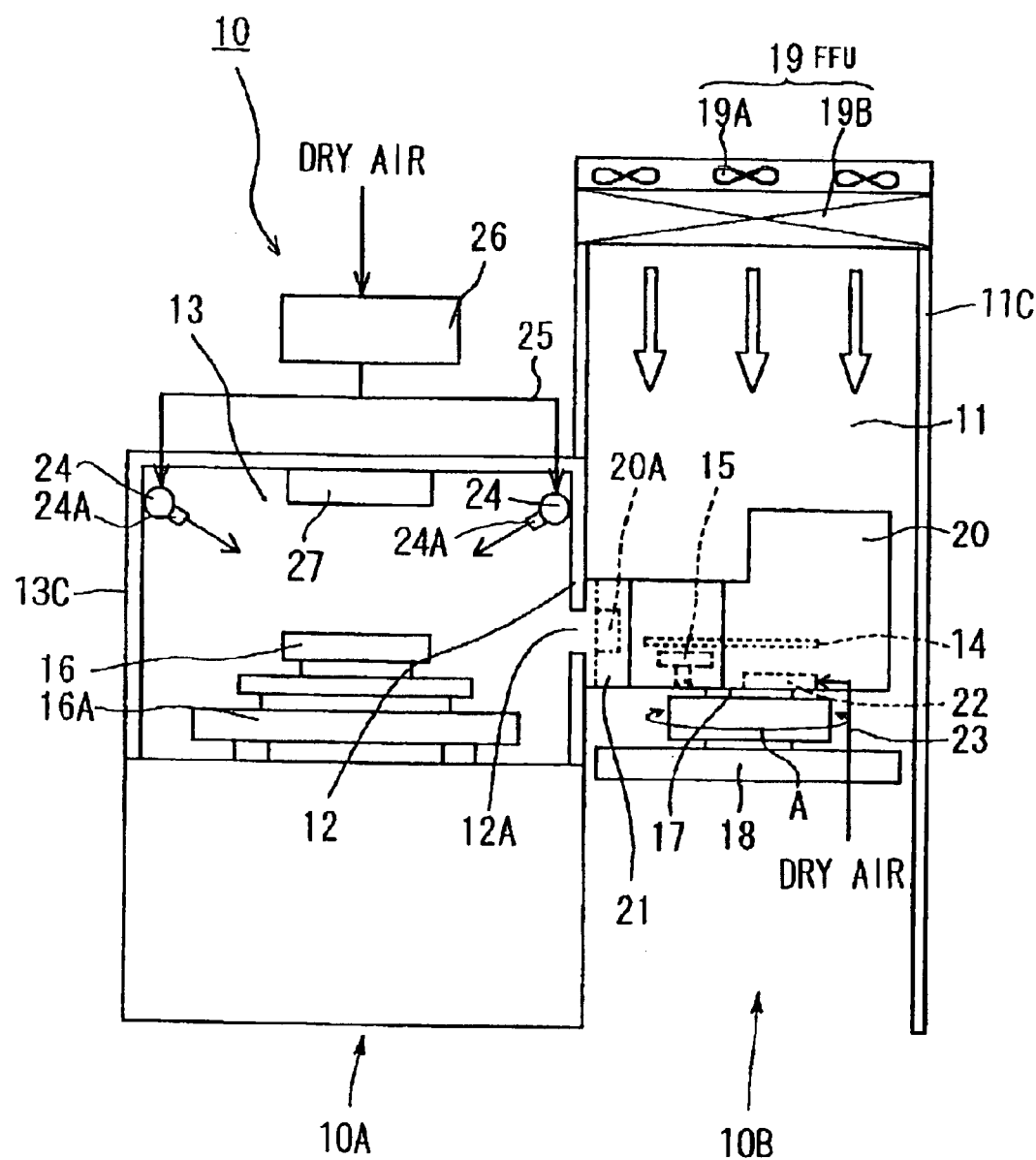
FIG. 1 is a sectional view schematically showing a preferred embodiment of a probe system according to the present invention.

As shown in FIG. 1, a probe system 10 in this preferred embodiment comprises a probe unit 10A and a loader unit 10B which are adjacent to each other via a partition wall 12.

Figure 4A:
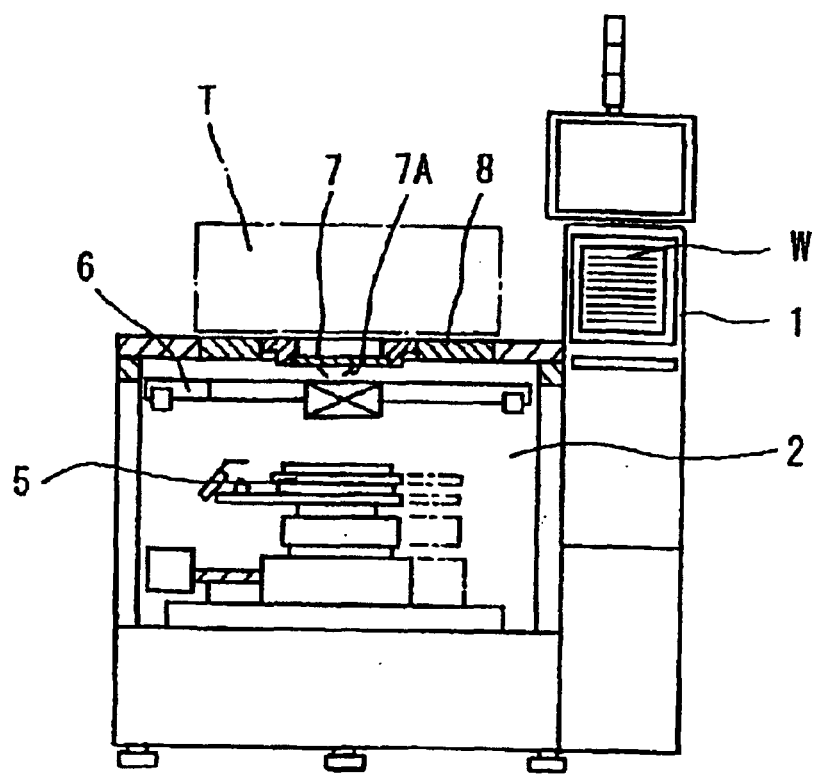
FIG. 4A is a partially sectional front view showing a conventional probe system.
Figure 4B:
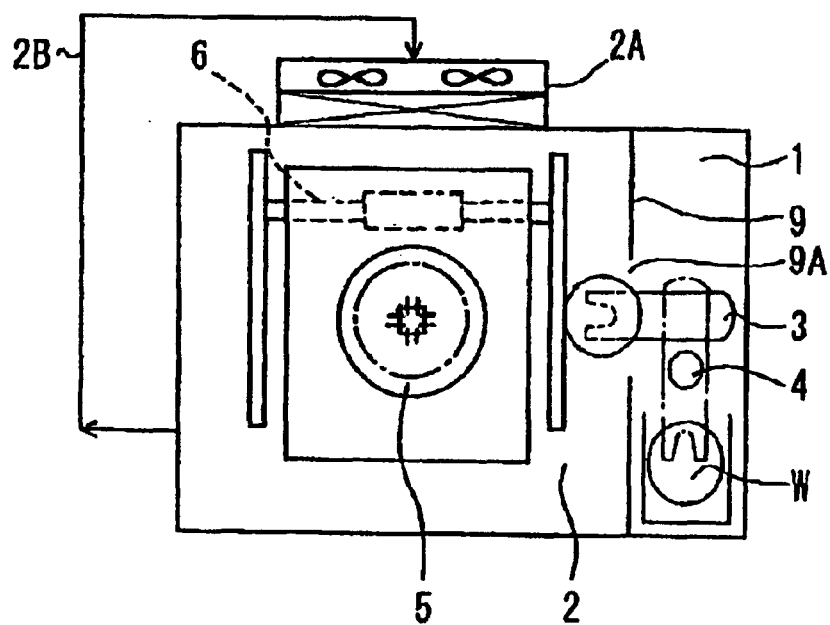
FIG. 4B is a horizontal sectional view of the probe system shown in FIG. 4A.

The probe unit 10A has a case 13C which defines a prober chamber 13 for receiving a semiconductor wafer W serving as an object to be tested, and a contact probe 27 for electrically testing the wafer W received in the prober chamber 13. As the contact probe 27, a general probe card having probe needles may be used. In the prober chamber 13, there is provided an alignment mechanism having the same structure as that of the alignment mechanism 6 shown in FIGS. 4A and 4B, and a main chuck 16. In order to transfer and test the wafer W, the main chuck 16 is designed to move in horizontal directions by an X-Y table 16A and to move in vertical directions and rotate about a vertical axis by a vertically moving and rotating mechanism provided therein.

The loader unit 10B has a case 11C which defines a loader chamber 11, and tweezers 14 serving as a carrying mechanism for carrying the wafer W between the prober chamber 13 and the loader chamber 11. In the loader chamber 11, a sub-chuck 15 serving as a pre-alignment mechanism is provided.

Figure 2:
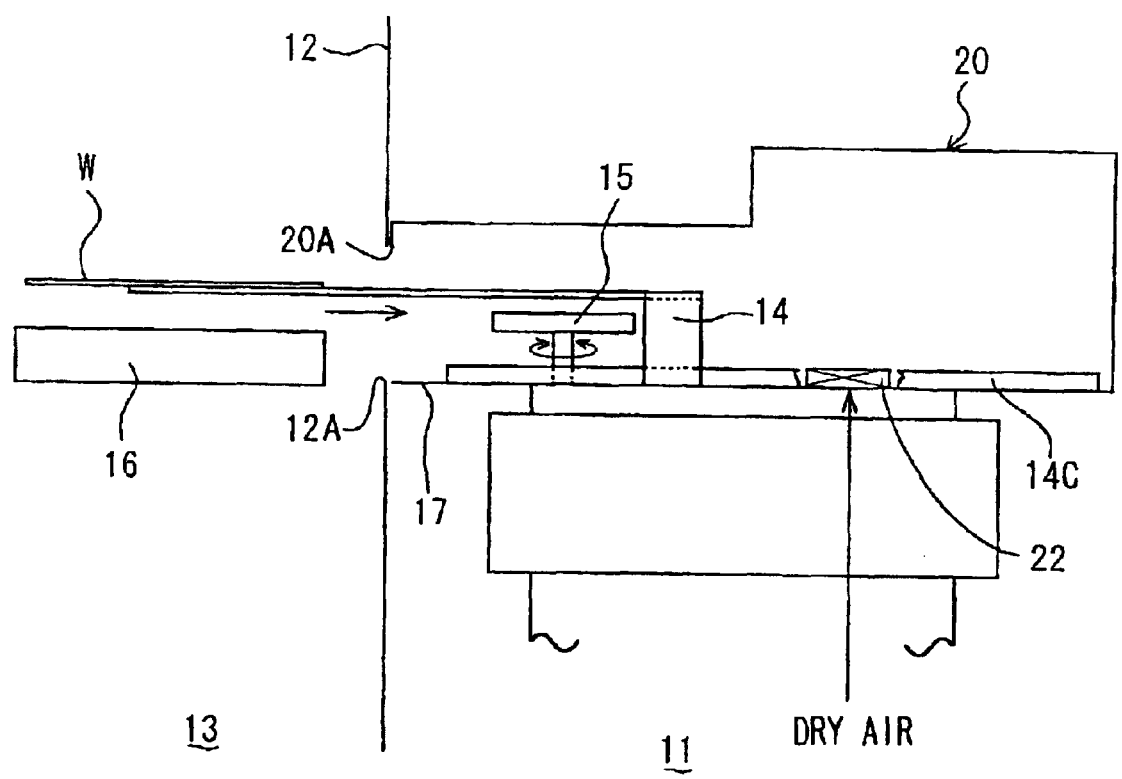
FIG. 2 is a sectional view schematically showing a principal part of the probe system shown in FIG. 1.

As shown in FIGS. 1 and 2, the tweezers 14 and the sub-chuck 15 are arranged on a base plate 17. The base plate 17 is designed to forwardly and reversely rotate about a vertical axis with respect to a base 18 by a rotating mechanism (not shown). The tweezers 14 are designed to carry the wafer W between the loader chamber 11 (or a cassette airtightly communicated with the loader chamber 11) and the main chuck 16 in the prober chamber 13.

The case 13C of the probe unit 10A and the case 11C of the loader unit 10B share the partition wall 12 between the loader chamber 11 and the prober chamber 13. The partition wall 12 is provided with an opening 12A which allows the passing of the tweezers 14. The opening 12A is provided with a sliding door (not shown), which is open only during the transfer of the wafer W, so as to cope with a test at a very low temperature of, e.g. about −65° C., in the prober chamber 13.

As shown in FIG. 1, the ceiling of the loader chamber 11 is provided with a fan filler unit (FFU) 19 which has a suction fan 19A and a filter 19B. The FFU 19 is designed to suck clean air in a clean room by the suction fan 19A and to supply the clean air to the loader chamber 11 via the filter 19B so as to enhance cleanliness in the loader chamber 11.

As shown in FIGS. 1 and 2, the tweezers 14 and the sub-chuck 15 are connected to a base plate 17 while being covered with a main shielding cover 20 in the loader chamber 11. Thus, the tweezers 14 and the sub-chuck 15 are placed in a space inside of the main shielding cover 20 which is independent of other regions in the loader chamber 11. The main shielding cover 20 is substantially cylindrical so as to be easy to rotate as described later and so as to reduce the supply rate of dry air (see FIG. 3). The main shielding cover 20 is provided with an opening 20A which allows the passing of the tweezers 14.

The tweezers 14 are designed to reciprocate in the main shielding cover 20, e.g. by means of a driving mechanism, such as a stepping motor, along a pair of guide rails 14C on the base plate 17 (only one guide rail 14C is shown in FIG. 2). The tweezers 14 enter and leave the prober chamber 13 via the openings 20A and 12A of the main shielding cover 20 and partition wall 12. Between the main shielding cover 20 and the partition wall 12, an auxiliary shielding cover 21 is provided. The auxiliary shielding cover 21 covers a space between the main shielding cover 20 and the opening 12A of the partition wall 12 to define a carrying passage for the wafer W carried by the tweezers 14.

Figure 3:
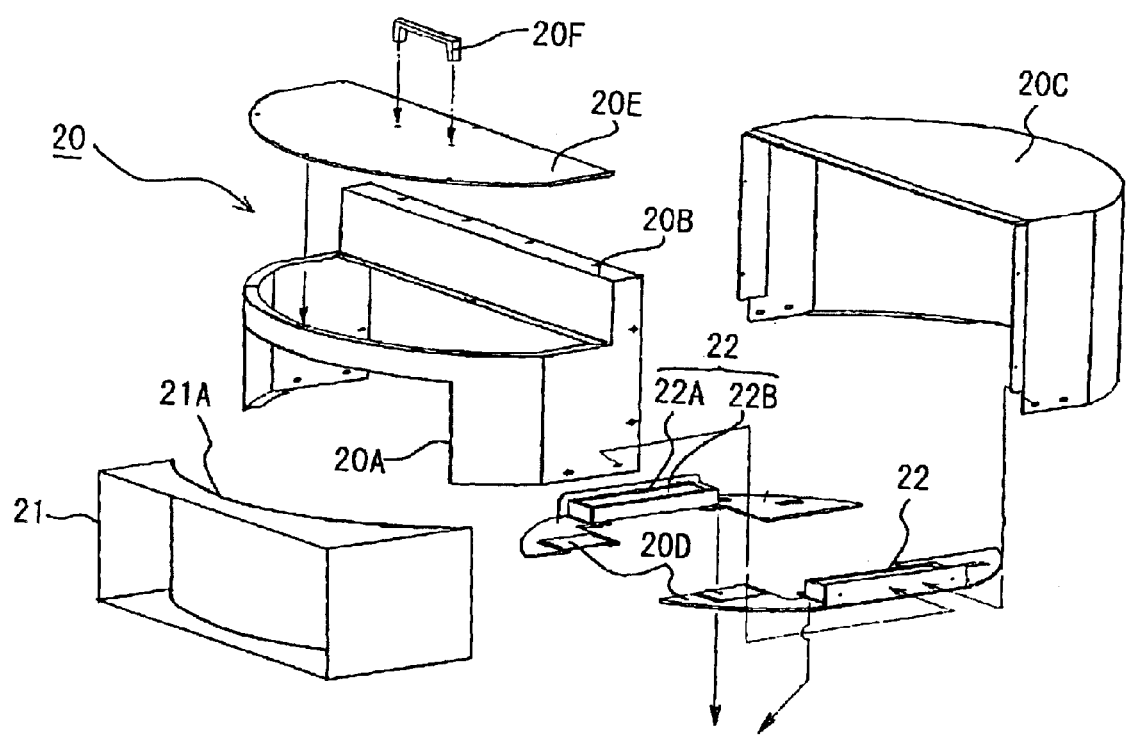
FIG. 3 is an exploded perspective view showing shielding covers of the probe system shown in FIG. 1.

In the main shielding cover 20, two air filters 22 are provided (see FIG. 3). The probe unit 10 is equipped with a means for supplying dry air of a low dew point into the main shielding cover 20 via the air filters 22. Thus, the space in the main shielding cover 20 is maintained to be in a low dew point environment. In addition, the pressure in the main shielding cover 20 is set to be slightly higher than the pressure in the space outside thereof in the loader chamber 11 so as to prevent air in the loader chamber 11 to enter the main shielding cover 20, so that the low dew point environment in the main shielding chamber 20 is maintained.

FIG. 3 is an exploded view showing the main shielding cover 20, the auxiliary shielding cover 21 and the air filters 22. The main shielding cover 20 comprises first and second covers 20B and 20C which are formed by dividing the main shielding cover 20 into two parts. The first cover 20B having the opening 20A for the tweezers 14 is formed so that a portion thereof near the opening 20A is lower than the second cover 20C. The bottom ends of the first and second covers 20B and 20C are connected to a pair of substantially arcuate bottom plates 20D, respectively. Each of the bottom plates 20D has a cut-out for connection to the base plate 17. The air filter 22 is mounted on each bottom plate 20D. The top face of the first cover 20B on the side of the opening 20A is formed as a detachable lid 20E with a handle 20F. For example, the lid 20E is detached during maintenance of the tweezers 14. The first and second covers 20B and 20C, the bottom plate 20D and the lid 20E are connected to each other by means of screws.

The auxiliary shielding cover 21 has an arcuate portion 21A formed along the outer periphery of the main shielding cover 20. The arcuate portion 21A is adjacent to the main shielding cover 20 via a slight gap. Thus, the main shielding cover 20 can forwardly and reversely rotate together with the base plate 17 while maintaining the slight gap between the main shielding cover 20 and the arcuate portion 21A of the auxiliary shielding cover 21.

Each of the air filters 22 has a rectangular parallelepiped housing 22A and a filter plate 22B mounted on a top opening of the housing 22A via a seal. Each of the air filters 22 is connected to, e.g. a dry air source in a clean room, via a piping 23 (FIG. 1) connected to the side face of the housing 22A. The filter plate 22B is formed of a porous metal (e.g. stainless) or a ceramic. The air filter 22 is designed to hold a higher cleanliness in the main shielding cover 20 than that in the loader chamber 11 outside thereof by filtering the dry air, which is supplied into the housing 22A from the dry air source, by means of the filter plate 22B. As the air filter 22, a filter of another type may be used.

As shown in FIG. 1, means for supplying dry air into the prober chamber 13 are also provided. First, internal piping members 24 are provided on the upper portion in the prober chamber 13. These internal piping members 24 are provided with a plurality of nozzles 24A, which are spaced from each other at regular intervals, respectively. The internal piping members 24 are connected to, e.g. a dry air source in a clean room, by means of external piping members 25. At an upstream side of the external piping member 25, a second air filter 26 is provided. By supplying clean dry air filtered by the second air filter 26 into the prober chamber 13, the same low dew point environment of high cleanliness as that in the main shielding cover 20 is formed in the prober chamber 13. The second air filter 26 may be the same as the air filter 22 in the main shielding cover 20, or may be a different type of filter.

The operation of the probe unit 10 will be described below.

During a low temperature test at a wafer temperature of −65 to 0° C., air in the clean room is sucked into the loader chamber 11 by means of the FFU 19, and dry air is supplied into the shielding cover 20 via the air filters 22. At this time, the pressure of dry air in the main shielding cover 20 is slightly higher than the pressure of air in the loader chamber 11 outside thereof, so that the air sucked into the loader chamber 11 does not enter the main shielding cover 20. On the other hand, the dry air filtered by the second air filter 26 is supplied into the prober chamber 13 from the nozzles 24A of the internal piping members 24. Thus, the interior of the main shielding cover 20 and the prober chamber 13 are filled with dry air having a high cleanliness and a low dew point.

Then, while the opening 12A of the shielding cover 20 faces a cassette (not shown) in the loader chamber 11, the tweezers 14 pass through the opening 20A to enter the cassette. After the wafer W to be tested is sucked onto the tweezers 14, the tweezers 14 are retracted into the main shielding cover 20. During that time, through the opening 20A, the main shielding cover 20 is communicated with the space outside thereof in the loader chamber 11. However, since the pressure in the main shielding cover 20 is higher than the pressure in the space outside thereof in the loader chamber 11, the interior of the main shielding cover 20 is maintained to be filled with the clean dry air.

Then, the sub-chuck 15 receives the wafer W from the tweezers 14, and carries out the pre-alignment of the wafer W. Thereafter, the tweezers 14 receive the wafer W from the sub-chuck 15 again. During that time, the tweezers 14 and the sub-chuck 15, together with the main shielding cover 20, rotate by 90 degrees with respect to the base 18. Thus, the opening 20A of the main shielding cover 20 faces the opening 12A of the partition wall 12 via the carrying passage for the wafer W in the auxiliary shielding cover 21.

Then, the door of the opening 12A is open, and the tweezers 14 pass through the carrying passage in the auxiliary shielding cover 21 to enter the prober chamber 13. At this time, the main chuck 16 is prepared to receive the wafer W from the tweezers 14 in the prober chamber 13. In the main chuck 16, 3-pins (not shown) rise to receive the wafer W from the tweezers 14. Then, the tweezers 14 are retracted from the prober chamber 13 into the main shielding cover 20, and the door of the opening 12A is closed. In the prober chamber 13, the 3-pins having received the wafer W are retracted into the main chuck 16, and the wafer W is put on the main chuck 16.

After the wafer W on the main chuck 16 is aligned by the alignment mechanism, the wafer W is electrically tested (low temperature tested) by the contact probe 27 while being indexed by the main chuck 16. During the test of the wafer W, the main chuck 16 and the wafer W are at a low temperature of −65 to 0° C., e.g. at about −40° C. However, since the surrounding dry air has a low dew point, water vapor does not condense and/or freeze on the main chuck 16 and wafer W.

After the test of the wafer W, the main chuck 16 moves to a standby position in the vicinity of the opening 12A of the partition wall 12. Then, the 3-pins lift the wafer W from the main chuck 16 to prepare to transfer the wafer W to the tweezers 14. At this time, as shown in FIG. 2, the tweezers 14 receive the wafer W from the main chuck 16 and are retracted into the main shielding cover 20. The tested wafer W received by the tweezers 14 is successively in a low temperature state. However, since the atmosphere in the main shielding cover 20 is dry air of a low dew point, water vapor does not condense and/or to freeze on the wafer W.

After the tweezers 14 and so forth, together with the main shielding cover 20, reversely rotate by 90 degrees, the wafer W is returned into the cassette. Before the tested wafer W is returned into the cassette, the tweezers 14 stand by in the main shielding cover 20 until the temperature of the wafer W returns to a room temperature. When the temperature of the wafer reaches a room temperature, the tweezers 14 enter to return the wafer W into the cassette. By returning the temperature of the wafer W to the room temperature, it is possible to prevent dew condensation and/or freezing on the wafer W in the loader chamber 11. By repeating the above described operations, all of the wafers W in the cassette are tested.

As described above, in this preferred embodiment, the main shielding cover 20 for covering the tweezers 14 and so forth in the loader chamber 11, and the means for supplying dry air into the main shielding cover 20 and the prober chamber 13, respectively, are provided. Therefore, when the wafer W is tested at a low temperature (−65 to 0° C.), it is possible to surely prevent the condensation and/or freezing of water vapor on the wafer W. Since it is also required to provide any FFUs and circulating ducts in the prober chamber 13, it is possible to reduce the costs for the probe system 10.

In this preferred embodiment, the auxiliary shielding cover 21 for covering the space between the main shielding cover 20 and the opening 12A of the partition wall 12 to define the carrying passage for the wafer W is also provided. Therefore, there is not the possibility that the tested wafer W of a low temperature is exposed to the outer air in the loader chamber 11 during the transfer of the wafer W, so that it is possible to surely prevent the condensation and/or freezing of water vapor on the wafer W. Since the FFU 19 for supplying clean air to the loader chamber 11 is provided, the interior of the loader chamber 11 can be held at a high cleanliness, so that it is possible to prevent the wafer W from being contaminated with particles. Since there are provided the filters 22 and 26 for removing dust in the dry air supplied into the main shielding cover 20 and the prober chamber 13, respectively, it is possible to maintain the dry air at a high cleanliness so as to more surely prevent the wafer W from being contaminated with particles.

The present invention should not be limited to the preferred embodiment, and each component may be suitably changed in the scope of the present invention.

What is claimed is:

1. A probe system comprises:
    a probe unit having a case defining a prober chamber for receiving an object to be tested, and a contact probe for testing said object received into said prober chamber; and
    a loader unit having a case defining a loader chamber communicating with said prober chamber, and a carrying mechanism for carrying said object between said prober chamber and said loader chamber,
    wherein said loader unit further has a main shielding cover for covering said carrying mechanism in said loader chamber, and
    said probe system further comprises means for supplying dry gas into an interior of the main shielding cover of said loader unit.

2. A probe system as set forth in claim 1, wherein said loader unit further has an alignment mechanism for aligning said object, said alignment mechanism being covered with said main shielding cover in said loader chamber.

3. A probe system as set forth in claim 1, wherein said main shielding cover is rotatable together with said carrying mechanism.

4. A probe system as set forth in claim 1, wherein said case of said loader unit has an opening for communication with said prober chamber, and said loader unit further has an auxiliary shielding cover for covering a space between said main shielding cover and said opening to define a carrying passage for said object.

5. A probe system as set forth in claim 4, said opening is provided with a door for selectively closing said opening.

6. A probe system as set forth in claim 1, which further comprises means for supplying clean air into said loader chamber.

* * * * *